United States Patent [19]

Goebel et al.

[11] Patent Number: 5,234,865

[45] Date of Patent: Aug. 10, 1993

[54] METHOD OF SOLDERING TOGETHER TWO COMPONENTS

[75] Inventors: Herbert Goebel, Reutlingen; Franz Riedinger, Burladingen; Vesna Biallas, Reutlingen, all of Fed. Rep. of Germany

[73] Assignee: Robert Bosch GmbH, Stuttgart, Fed. Rep. of Germany

[21] Appl. No.: 842,236

[22] Filed: Feb. 26, 1992

[30] Foreign Application Priority Data

Mar. 28, 1991 [DE] Fed. Rep. of Germany ....... 4110318

[51] Int. Cl.$^5$ .................................. H01L 21/60
[52] U.S. Cl. ................................ 437/209; 437/214; 437/904; 228/123.1; 228/447
[58] Field of Search ............... 437/209, 214, 904; 228/122, 123, 249, 246, 44.3, 44.5, 44.7; 357/74, 81, 70

[56] References Cited

U.S. PATENT DOCUMENTS

| | | | |
|---|---|---|---|
| 3,593,412 | 7/1971 | Foote | 437/214 |
| 3,860,949 | 1/1975 | Stoeckert et al. | 357/65 |
| 4,074,420 | 2/1978 | Lofdahl | 228/123 |
| 4,141,030 | 2/1979 | Eisele et al. | 357/81 |
| 4,540,603 | 9/1985 | Hidaka et al. | 437/209 |
| 4,650,107 | 3/1987 | Keser | 228/123 |
| 4,810,672 | 3/1989 | Schwarzbauer | 228/123 |
| 4,989,773 | 2/1991 | Ishiyama | 228/122 |
| 5,082,161 | 1/1962 | Utida et al. | 228/122 |

*Primary Examiner*—Brian E. Hearn
*Assistant Examiner*—Kevin M. Picardat
*Attorney, Agent, or Firm*—Frishauf, Holtz, Goodman & Woodward

[57] ABSTRACT

The invention relates to a method for soldering together a first, in particular electrical, component with a second, in particular electrical, component, where a solder preform is disposed between the components and is fixed by pressing it against edges of at least one depression in one of the components to prevent lateral dislocation and where subsequently the soldering process takes place, preferably in a soldering furnace. A special feature is that the depression is formed as grooves (10) extending in a closed loop (11), in particular in the shape of a circle.

10 Claims, 2 Drawing Sheets

METHOD OF SOLDERING TOGETHER TWO COMPONENTS

CROSS REFERENCE TO RELATED PATENT THE DISCLOSURE OF WHICH IS HEREBY INCORPORATED BY REFERENCE

U.S. Pat. No. 3,860,949, STOECKERT & HUNT/RCA, Jan. 14, 1975.

FIELD OF THE INVENTION

The invention relates to a method for soldering together a first, in particular electrical, component with a second, in particular electrical, component, where a solder preform is disposed between the components and is fixed by pressing it against edges of at least one depression in one of the components to prevent lateral dislocation and where subsequently the soldering process takes place, preferably in a soldering furnace.

BACKGROUND

Electrical or electronic components, for example semiconductor chips, are soldered into housings for the purposes of electrical contact, for heat dissipation and as a protection against damage. For example, in a known embodiment of a power diode, the silicon chip is fixed between two cylindrical copper parts by soldering. In this case a disk of solder is placed on one copper cylinder, the chip is placed on top of it and subsequently a second disk of solder is applied, on which the other copper cylinder is then placed. The two cylindrical copper parts each have a center depression on which, to prevent lateral dislocation, the relatively easily deformable disks of solder are held after being pressed against them so that the edges of the depressions penetrate the soft solder. In the course of placement of the parts on each other (copper cylinder with disk of solder/chip/copper cylinder with disk of solder) and subsequent soldering in a continuous furnace the said parts are kept together in a magazine (bore of a support body). This is necessary because the parts are being moved on conveyor belts during the production process described above. The conveyor belts are moved at great acceleration between the processing stations to attain high rates of production. Mismatches between the individual parts would occur without the magazines.

Chips with large surfaces (greater than 10 mm²) are used, particularly in connection with the above mentioned power semiconductor components, to keep losses during operation low and to assure good heat dissipation. It is necessary to form thin solder layers for good heat dissipation (the thickness of the solder layer should be between 20 $\mu$m and 60 $\mu$m). The heat dissipation is impaired if bubbles (hollow spaces) are created in the soldering process, so that soldering with as few bubbles as possible is the goal. This entails considerable expenditures. The chip surfaces are covered with special oxidation-resistant metal surfaces (gold, silver). The connecting pieces (for example the said cylindrical copper parts) are specially cleaned. Soldering is performed in so-called muffle furnaces in the presence of a reducing gas atmosphere of the highest purity ($H_2$ or $N_2/H_2$).

Bubbles are being observed in the solder layers in spite of all these efforts. These are caused by the entrapment of air between the solder preform and the associated connecting piece. One source for this entrapment of air is the fixing of the solder preform on the connecting piece (component). However, this fixing of the solder preform prior to soldering is necessary in order to prevent the already mentioned mismatch between the connecting piece, the chip and/or the solder preform. The above discussed use of magazines for bringing the components into alignment in relation to each other is insufficient, since because of its small size the solder preform is not guided (aligned) by the magazine. Because it is intended, on the one hand, to create thin layers of solder, but on the other hand the solder preforms of little thickness can no longer be automatically processed because of the easy deformability of the soft solder, it is necessary to make the thickness of a not yet soldered solder preform greater than the thickness of the solder layer which forms later. For this reason the size/diameter of this solder preform is less in the non-soldered state than the size/diameter of the components to be soldered together. For aligning the components in relation to each other, the size of the bore in the magazine corresponds to the diameter of the components. For the above mentioned reasons the solder preform has a lesser diameter so that it cannot be brought into alignment by the wall of the bore. Thus it is necessary to fix the solder preform on one component by means of the described joining prior to soldering in order to prevent lateral displacement. If lateral displacement did occur it would result in wedge-shaped soldering layers of poor quality between the components. The solder preforms are fixed in a centered way on the soldering surfaces of the connecting pieces by the joining operation.

It is known from U.S. Letters Pat. No. 3,860,949, Stoeckert et al., to form straight grooves which are placed parallel next to each other on the soldering surfaces of components. This provides an improvement of the soldered connection; however, the use of such grooves for the simultaneous fixing of solder preforms cannot be found in the cited reference.

Up to now a centered bore (depression) for fixing the solder preform in the component had been formed, so that the bore edges could penetrate into the soft solder preform. It has been found that there is considerable danger of the formation of large bubbles in this connection.

THE INVENTION

In contrast thereto, the method of the invention has the advantage that secure fixing between the component and the solder preform is assured and that the danger of the formation of bubbles after the soldering process is extraordinarily low. It is not possible to avoid the formation of bubbles completely; however, it has been reduced and furthermore only leads to the formation of very small bubbles which are essentially insignificant. To achieve this, the depression is embodied as a groove extending in a closed loop, in particular as a circle. Thus the groove may have a circular shape, an oval shape or an irregular, but closed shape. The embodiment as a circular groove is preferred.

In accordance with a particular embodiment, a plurality of concentrically adjoining grooves is formed. This is particularly advantageous if the components (for example connecting piece and semiconductor chip) are embodied rotationally symmetrical. The grooves in the shape of concentric rings are particularly well suited for attaching a disk-shaped solder preform. In particular, it is possible to insert solder preforms made in circular shapes. The rotational symmetry is maintained during stamping of circular or circular-disk-shaped solder preforms because of the circular groove or of the concentric grooves. Preferably the soldering surfaces on the connecting pieces always have a slight convex bulge having its highest point in the center of the surface. Bubbles in the center are prevented by this. Furthermore, the grooves closed on themselves assist the symmetrically even "run-out" of the solder preform to the outside, so that the entire chip is involved in the soldering process. Homogeneous distribution of the solder underneath the chip is assured by the described radially symmetrical disposition. This uniform distribution is aided by the concentric grooves (circular channels). Furthermore, the solder preform is attached to the soldering surface in a centered fashion by means of the method of the invention. Slanted positions of the components in relation to each other are prevented by this. A uniform expansion compensation in the course of stress due to temperature changes takes place on account of the rotationally symmetrical embodiment of the grooves, i.e. the rotational symmetry is maintained even then.

It has been provided in particular that the groove is embodied having a triangular cross section.

The depth of the groove lies between 10 and 60 $\mu$m, in particular at approximately 30 $\mu$m.

The diameter of the circular groove preferably is 0.5 to 1.5 mm, in particular 0.9 mm. This measurement applies to the circular groove located the farthest inward (groove center - groove center). If additional grooves located concentrically thereto are provided, they have a radial distance (groove center - groove center) from each other of preferably 0.2 to 0.6 mm, particularly approximately 0.4 mm.

The drawings illustrate the invention by means of an exact embodiment.

DETAILED DESCRIPTION

Figure 1:
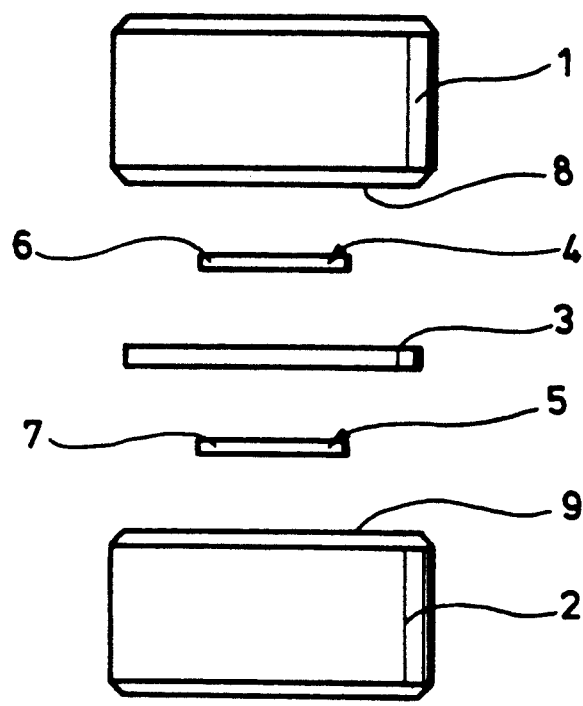
FIG. 1 shows two connecting pieces with solder preforms located between them and a semiconductor chip.

FIG. 1 shows the individual parts of a power diode. However, it should be mentioned here that the invention is not limited to soldering together individual parts of a power diode, but that arbitrary components can be soldered together.

A semiconductor chip 3, in particular a silicon chip, is to be disposed between two nickel-plated connecting pieces 1 and 2. The silicon chip may have a square cross section with an edge length of 4.5 mm, for example. In order to be able to solder the connecting pieces 1 and 2 together with the semiconductor chip 3, solder preforms 4 and 5 are disposed each between the connecting pieces 1 or 2 and the semiconductor chip 3. In a preferred manner, the solder preforms 4 and 5 are formed as circular-disk-shaped pieces of solder 6 or 7. The two disks of solder 6 and 7 have a diameter of 1.7 mm and a thickness of 0.6 mm.

The sides 8 and 9 of the two connecting pieces facing each one of the disks of solder 6 and 7 are provided with a plurality of grooves 10 located concentrically to each other. This becomes apparent from FIGS. 3 and 4, which only show a section of the connecting piece 2. The connecting piece 1 is correspondingly designed so that it is not necessary to go into this in detail here.

Each groove 10 extends in a closed loop 11. This loop 11 is preferably formed as a circle (see FIG. 4). The grooves 10 are preferably stamped into the surfaces of the connecting pieces 1 and 2. This stamping may take place in the same tool during the shaping of the piece or after shaping by means of a separate stamping die.

Figure 3:
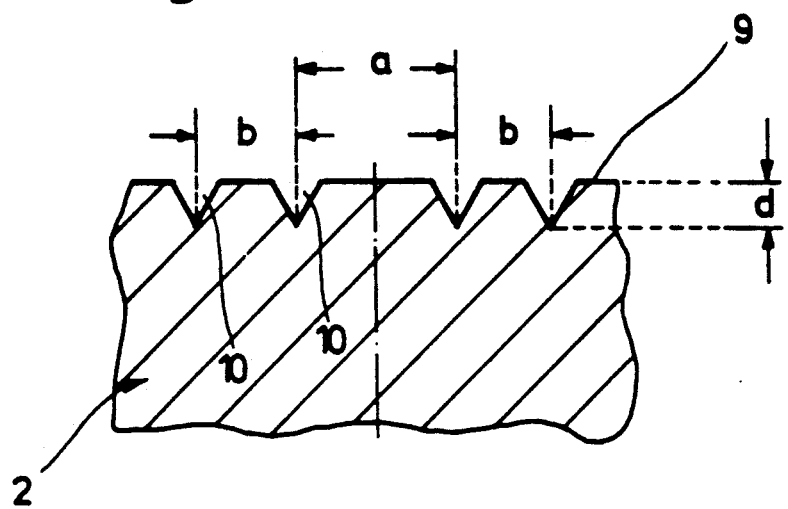
FIG. 3 is a cross-sectional view of a portion of a connecting piece.
Figure 4:
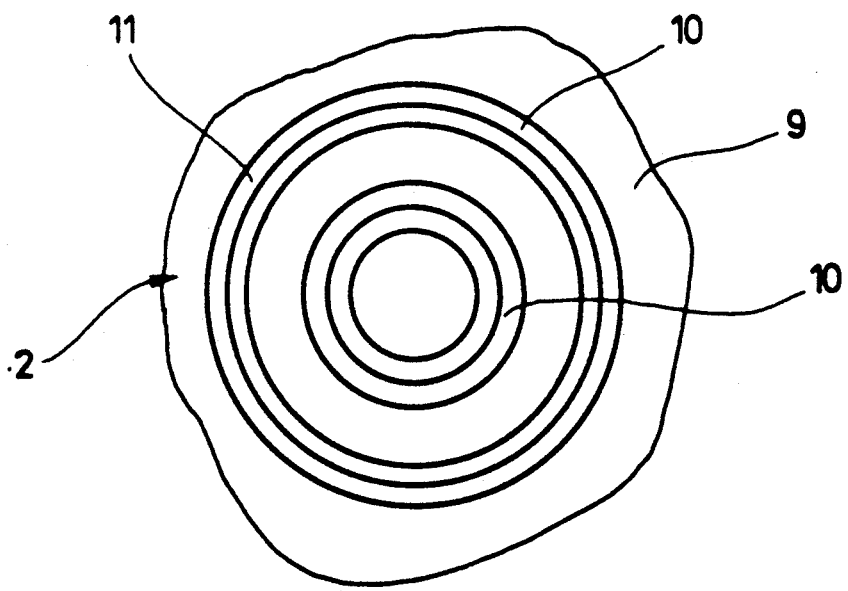
FIG. 4 is a top view in accordance with the view of FIG. 3.

The depth d of the grooves is 30 $\mu$m in accordance with FIG. 3. The diameter of the circular groove 10 with the smallest diameter is a=0.9 mm. The radial distance between adjoining concentric grooves 10 is on the order of b=0.4 mm. Preferably each connecting piece 1 and 2 is provided with six concentric grooves 10.

A solder of a composition of 96 weight-% of lead and 4 weight-% of tin, having a degree of purity of 99.99% is used for the disks of solder 6 and 7. The disks of solder 6 and 7 are positioned in the center of the surfaces 8 or 9 of the connecting pieces 1 or 2 and pressed on. A pressure of 50 kN/cm$^2$ has proven to be optimal. In the course of this joining process the edges of the grooves 10 are pressed into the soft solder, so that the disks of solder 6 and 7 are fixed to prevent lateral displacement.

Figure 2:
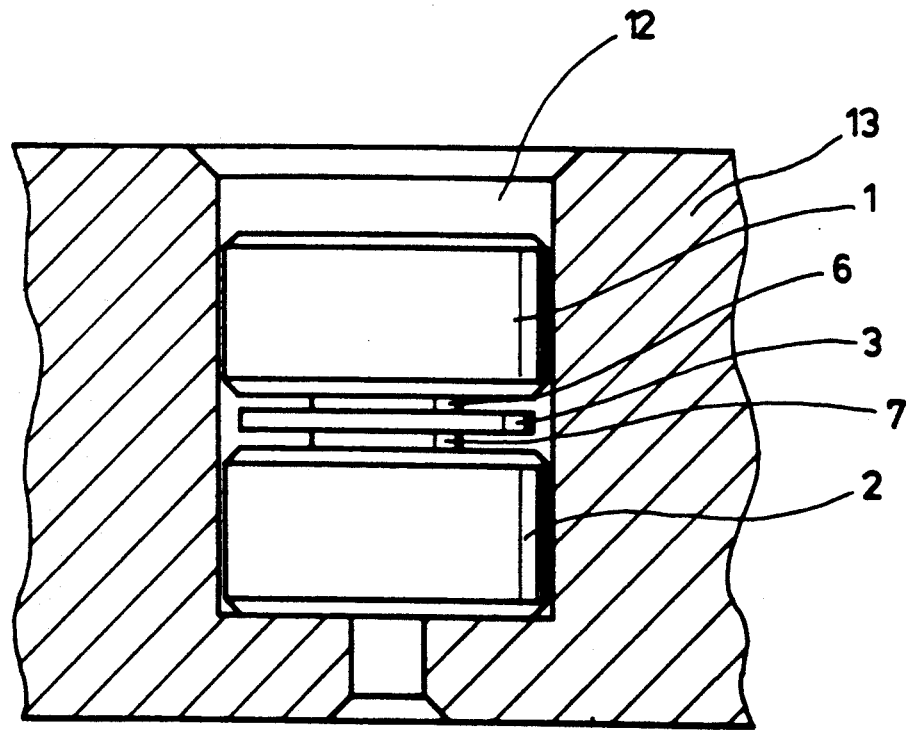
FIG. 2 shows the arrangement in accordance with FIG. 1 inside an alignment magazine.

In accordance with FIG. 2 the pieces have been inserted into the bore 12 of a magazine 13. The connecting piece 2, on which the disk of solder 7 is fixed, is in the lowest position. The semiconductor chip 3 is disposed on top of it. The upper closure is formed by the connecting piece 1, on which the disk of solder 6 is fixed. The diameter of the bore has been selected to be such that it corresponds to the exterior diameters of the connecting pieces 1 and 2 and the corners of the straight semiconductor chip.

The disks of solder 6 and 7 have smaller diameters than the connecting pieces 1 and 2, so that they cannot be brought into line by the wall of the bore 12. However, since they are laterally fixed by means of being pressed against the grooves 10 of the connecting pieces 1 and 2, they remain in their place even during jarring etc., in the course of subsequent processing.

The magazine 13 is placed into a muffle furnace for performing the soldering process. A temperature of preferably 380° C. +/−5° C. prevails therein, along with a forming gas atmosphere of 88 volume-% of N$_2$/12 volume-percent H$_2$.

The solder preforms melt in the heat of the muffle furnace and the circular grooves 10 assure the uniform rotationally symmetrical "run-out" of the solder. When the components (connecting part 1, semiconductor chip 3 and connecting part 2) leave the muffle furnace they are soldered together and only a very few, if any, and very small bubbles occur in the soldering area, the size of the bubbles being limited by the distance between the grooves 10.

Use of the method in accordance with the invention results in a clear reduction of the temperature stress of the power diodes in the course of stresses due to continuous pulse effects. In the same way the rise of temperature resistance during stresses of the component because of temperature changes is slowed (improved and longer heat connection of the semiconductor chips 3 with the connecting pieces 1 and 2 (heat sinks)).

Various changes and modifications may be made, and features described in connection with any one of the embodiments may be used with any of the others, within the scope of the inventive concept.

We claim:

1. A method for soldering together a first electrical component with a second electrical component,
   where a solder preform is disposed between the components and is fixed by pressing it against edges of at least one depression in one of the components to prevent lateral dislocation and
   where subsequently the soldering process takes place in a soldering furnace,
   wherein
   the depression is formed as at least one groove (10) extending in a closed loop (11).

2. A method according to claim 1, wherein
   multiple grooves (10), located concentrically with respect to each other, are formed.

3. A method according to claim 1, wherein
   the at least one groove (10) has a triangular cross section.

4. A method according to claim 1, wherein
   the groove (10) is circular and is formed concentric with a center of at least one of said first and second components.

5. A method according to claim 1, wherein
   a connecting piece (1, 2) is used as the first component and a semiconductor chip (3) as the second component.

6. A method according to claim 1, wherein
   the solder perform (4, 5) is formed as a disk-shaped piece of solder (6, 7).

7. A method according to claim 6, wherein
   the diameter of the disk-shaped piece of of solder (6, 7) is less than the diameter of the first and second components.

8. A method according to claim 1, wherein
   the depth (d) of the groove (10) is in a range from 10 to 60 micrometers.

9. A method according to claim 4, wherein
   the diameter (a) of the circular groove (10) is 0.5 mm to 1.5 mm.

10. A method according to claim 2 wherein
    the radial distance (b) between each of a plurality of concentric grooves (10) is 0.2 to 0.6 mm.

* * * * *